United States Patent
Shih et al.

(10) Patent No.: US 6,294,963 B1
(45) Date of Patent: Sep. 25, 2001

(54) VOLTAGE-CONTROLLED OSCILLATOR

(75) Inventors: Her-Y Shih; Jean-Ming Lee; Chu-Chiao Yu, all of Hsin-Chu (TW)

(73) Assignee: Topic Semiconductor Corp., Hsin-Chu (TW)

(*) Notice: Subject to any disclaimer, the term of this patent is extended or adjusted under 35 U.S.C. 154(b) by 0 days.

(21) Appl. No.: 09/660,937

(22) Filed: Sep. 13, 2000

(51) Int. Cl.[7] ............................. H03B 5/24; H03B 7/089
(52) U.S. Cl. ..................... 331/57; 331/17; 331/175; 331/186; 327/157
(58) Field of Search ........................... 331/17, 34, 57, 331/175, 176, 177 R, 185, 186; 327/111, 156–159

(56) References Cited

U.S. PATENT DOCUMENTS 5,896,068 * 4/1999 Moyal ............................. 331/34

* cited by examiner

Primary Examiner—David Mis
(74) Attorney, Agent, or Firm—Bacon & Thomas, PLLC

(57) ABSTRACT

A voltage-controlled oscillator comprising a voltage compensation transistor is disclosed. The voltage compensation transistor is able to provide an equivalent resistance to the bias voltage supplied to the oscillator. When a sudden raise in the voltage of the power supply takes place, the equivalent resistance of the compensation transistor will drop, such that the bias voltage supplied to the oscillator may be pulled down, whereby the oscillation frequency of the ring oscillator may be adjusted.

2 Claims, 3 Drawing Sheets

VOLTAGE-CONTROLLED OSCILLATOR

FIELD OF THE INVENTION

The present invention relates to a voltage-controlled oscillator (VCO), especially to a voltage-controlled oscillator with improved power supply rejection ratio (PSRR) effects.

BACKGROUND OF THE INVENTION

A conventional voltage-controlled oscillator (VCO) is shown in FIG. 1. Such a VCO is used in a phase lock loop (PLL). The power supply rejection ratio (PSRR) feature of the VCO is decisive of its jitter. As shown in FIG. 1, a VCO circuit comprises a charge pump circuit 10 and a ring oscillator 20. The charge pump circuit 10 comprises two charge pumps, PUMP-up and PUMP-down. With the ON and OFF operations of two switches UP and DOWN in sequence, the voltage at PUMP may be controlled. VDD is power supplied to the circuit. In such a circuit, the voltage at PUMP changes along with the change of the voltage of VDD. The voltage of VDD-PUMT is transformed into current by transistor 11 and into a bias by transistor 12. The bias is supplied to the ring oscillator 20.

The ring oscillator 20 comprises several oscillator circuits 21, 22 and 23 which are connected as a ring. Bias supplied by transistor 12 drives the ring oscillator 20 to generate oscillation. With this circuit, oscillation at a pre-determined frequency may be generated by the ring oscillator 20 according to the difference of the voltage at PUMP and the VDD voltage.

The above-mentioned conventional voltage-controlled oscillator is capable of generating oscillations under a pre-determined frequency according to the voltage of the input voltage. However, when the voltage of VDD has a sudden change, the oscillation frequency of the oscillator will raise in response to the raise of the VDD voltage. As a result, an undesired change will be caused to the oscillation frequency of the ring oscillator.

It is thus a need in the industry to provide an improved voltage-controlled oscillator in which the influence of the voltage of the power supply to the oscillator frequency of the oscillator may be moderated.

OBJECTIVES OF THE INVENTION

The objective of this invention is to provide a novel voltage-controlled oscillator wherein influence brought by the voltage of the power supply to the oscillator frequency of the ring oscillator may be reduced.

Another objective of this invention is to provide a voltage-controlled oscillator with an automatic compensation effect to the variation of the voltage of the power supply.

SUMMARY OF THE INVENTION

According to the voltage-controlled oscillator of this invention, a voltage compensation transistor is provided in the circuit of the voltage-controlled oscillator. The voltage compensation transistor is able to provide an equivalent resistance. When a sudden raise in the voltage of the power supply takes place, the equivalent resistance of the compensation transistor will drop, such that the bias voltage supplied to the oscillator may be pulled down, whereby the oscillation frequency of the ring oscillator may be adjusted.

The above and other objectives and features of the voltage-controlled oscillator of this invention may be clearly understood from the detailed description by referring to the drawings.

DETAILED DESCRIPTION OF THE INVENTION

Figure 1:
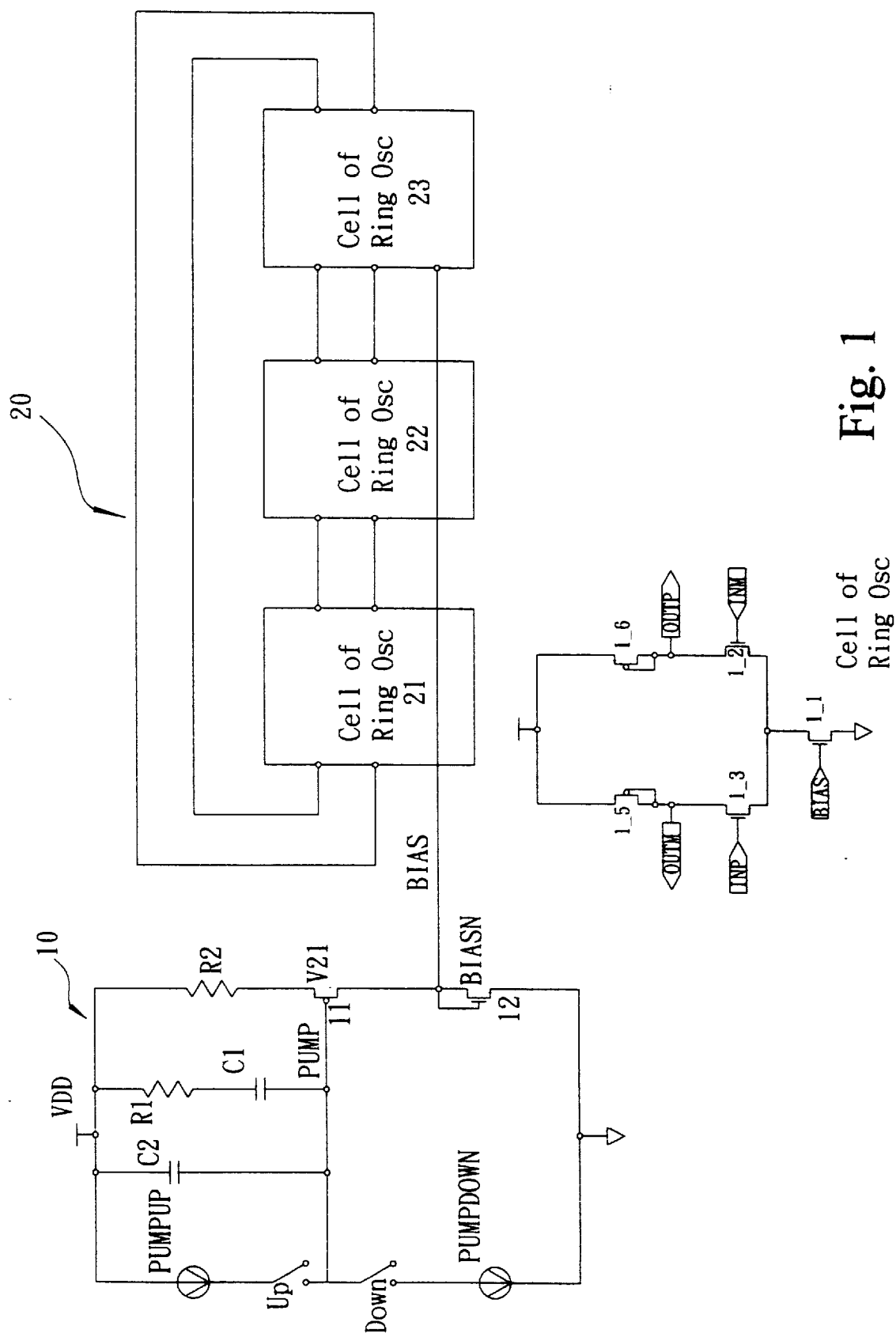
FIG. 1 illustrated the block diagram of a conventional voltage-controlled oscillator.
Figure 2:
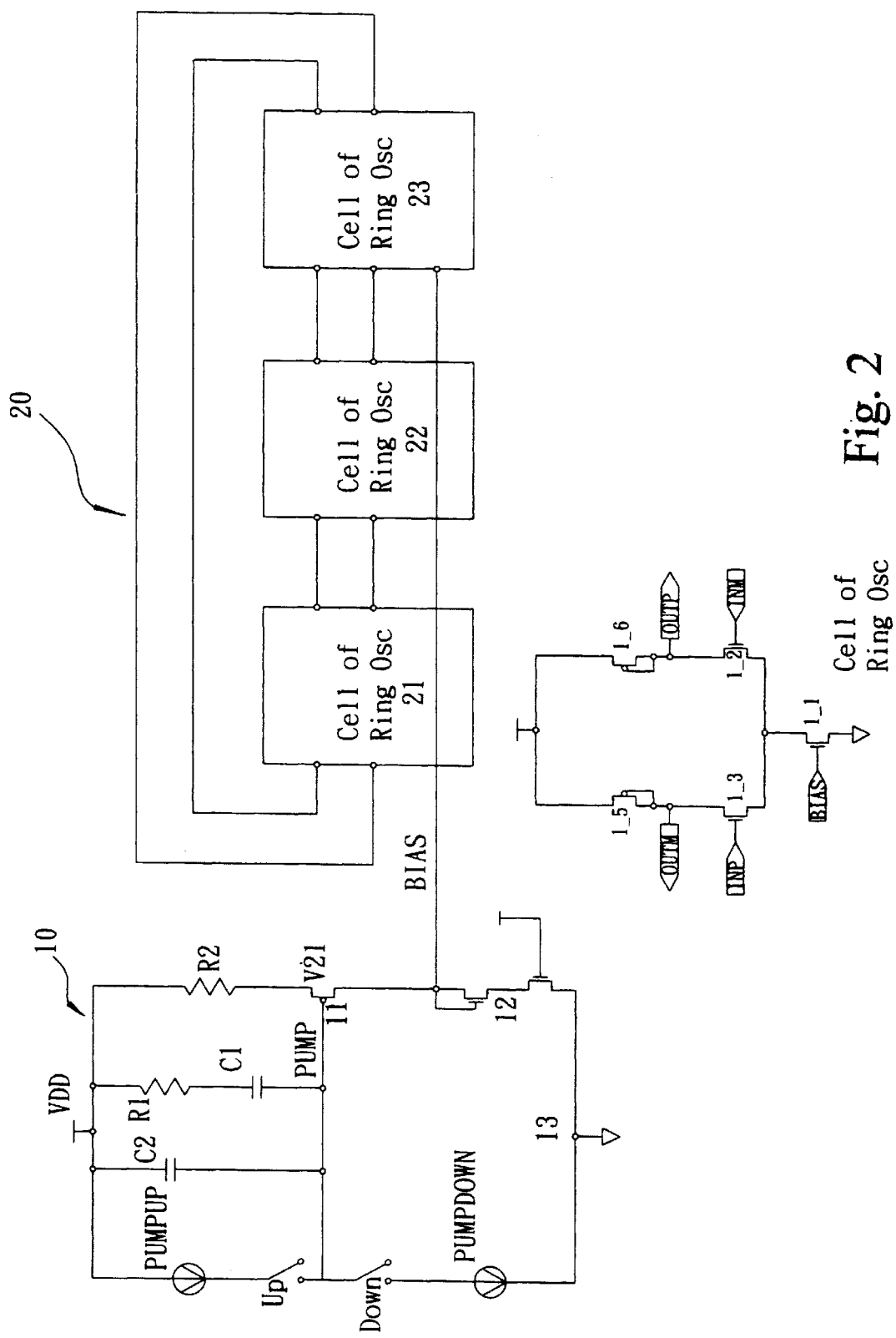
FIG. 2 illustrates the block diagram of the voltage-controlled oscillator of this invention.

The voltage-controlled oscillator of this invention will be described in the followings. FIG. 2 illustrates the voltage-controlled oscillator of this invention. In this figure, elements which are the same as that in FIG. 1 are labeled with the same numbers. As shown in this figure, the voltage-controlled oscillator of this invention also has a charge pump circuit 10 and a ring oscillator 20. The charge pump circuit 10 also has charge pumps PUMP-up and PUMP-down. Through the ON and OFF operations of switches UP and DOWN, the voltage at point PUMP, as supplied by VDD, may be controlled. When the voltage at the charge pumps is fixed, the voltage at point PUMP will have a fixed value relative to the voltage of VDD, VDD-PUMP. The voltage at point PUMP is transformed into currency by transistor 11 and further to a bias through the operation of transistor 12. The bias is supplied to the ring oscillators 20. The ring oscillator 20 has a ring of three oscillators 21, 22 and 23 and oscillate due to the supply of the bias. Because the bias supplied by transistor 12 and the voltage of VDD-PUMP are in direct ratio, the oscillator frequency of the ring oscillator 20 will in direct ratio to the voltage of VDD-PUMP.

The major difference between this invention and the conventional art is that a voltage compensation transistor 13 is provided. The voltage compensation transistor 13 is connected in series with transistor 12 and its source is grounded.

When there is a sudden raise in the voltage of the power supplied, the equivalent resistance of formed by the voltage compensation transistor 13 will decrease too. As a result, the working frequency of the oscillator 20 will be decreased along.

In other words, due to the voltage compensation transistor 13, the influence of a sudden raise in the voltage of the power supply to the oscillator frequency may be adjusted. As a result, the oscillation frequency of the voltage-controlled oscillator is controlled only by the voltage at point VDD-PUMP, whereby its sensibility to the voltage of the power supply may be modified.

EFFECTS OF THE INVENTION

Figure 3:
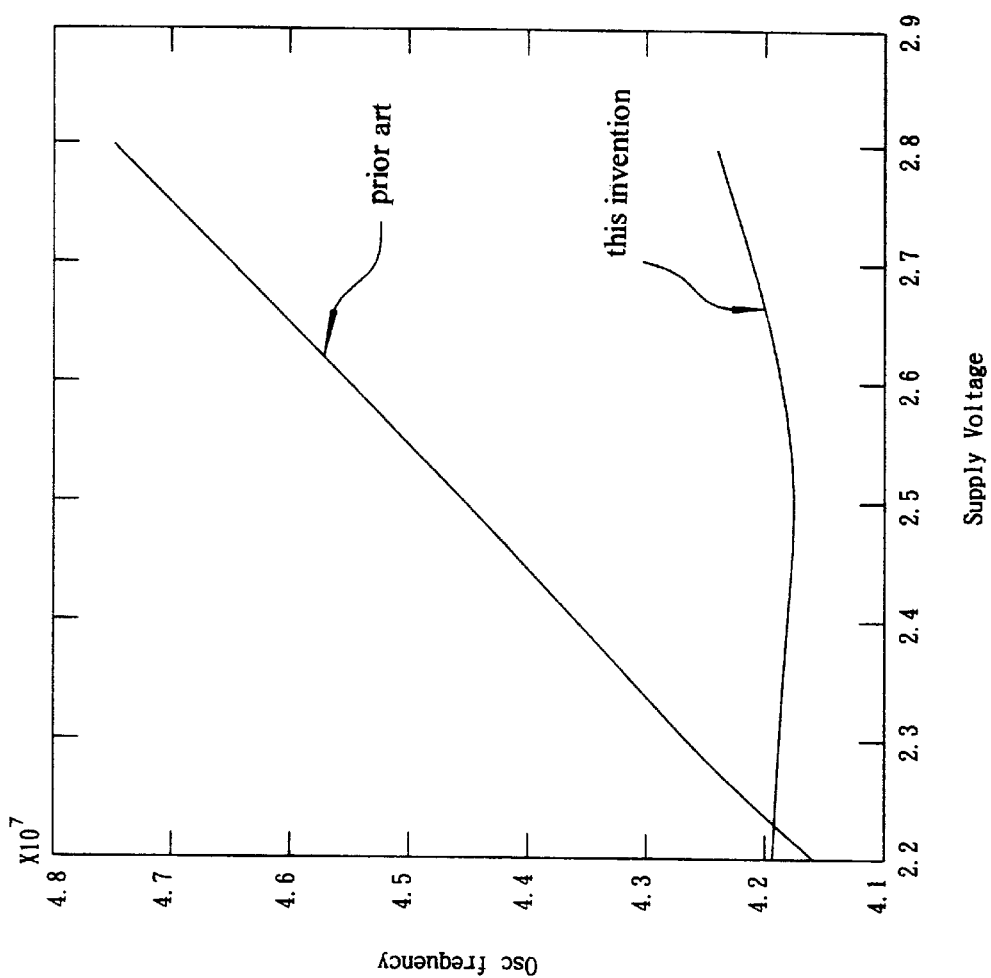
FIG. 3 shows the relation between the voltage of the power supply and the oscillation frequency of a conventional voltage-controlled oscillator and the voltage-controlled oscillator of this invention.

The oscillation frequency of the voltage-controlled oscillator of this invention is measured under a computer simulation environment. In the simulation procedure, the voltage of point PUMP is maintained constant relatively to the voltage of VDD. FIG. 3 shows the relation between the voltage of the power supply and the oscillation frequency of the voltage-controlled oscillator of this invention. As shown in FIG. 3, the oscillation frequency of the voltage-controlled oscillator of this invention may be maintained relatively stable despite the variation of the voltage of the power supply.

As the present invention has been shown and described with reference to preferred embodiments thereof, those skilled in the art will recognize that the above and other changes may be made therein without departing from the spirit and scope of the invention.

What is claimed is:

1. A voltage-controlled oscillator comprising:
   a charge pump circuit comprising a first transistor to convert a power source voltage into a current, and a second transistor to supply a bias voltage based on said current supplied by said first transistor; and
   a ring oscillator comprising a plurality of oscillator circuits to generate oscillation signals according to said bias voltage supplied by said second transistor;
   characterized in that said charge pump circuit further comprises a voltage compensation means to pull down said bias voltage supplied by said second transistor when said power source voltage raises, such that said bias voltage supplied to said ring oscillator may be adjusted.

2. The voltage-controlled oscillator according to claim 1 wherein said voltage compensation means comprises a transistor connected in series with said second transistor and wherein source of said voltage compensation transistor is grounded.

* * * * *